(12) United States Patent
Zhu et al.

(10) Patent No.: US 10,374,606 B2
(45) Date of Patent: Aug. 6, 2019

(54) HIGH VOLTAGE LEVEL SHIFTER WITH SHORT PROPAGATION DELAY

(71) Applicant: Texas Instruments Incorporated, Dallas, TX (US)

(72) Inventors: Danyang Zhu, Beijing (CN); Jie Feng, Beijing (CN); Xiaonan Wang, Beijing (CN); Ball Fan, Tianjin (CN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/260,428

(22) Filed: Jan. 29, 2019

(65) Prior Publication Data
US 2019/0158093 A1 May 23, 2019

Related U.S. Application Data

(60) Division of application No. 15/959,176, filed on Apr. 21, 2018, now Pat. No. 10,230,372, which is a
(Continued)

(51) Int. Cl.
*H03K 19/0185* (2006.01)
*H03K 5/19* (2006.01)
(Continued)

(52) U.S. Cl.
CPC ..... *H03K 19/018507* (2013.01); *H03K 5/003* (2013.01); *H03K 5/19* (2013.01);
(Continued)

(58) Field of Classification Search
CPC ............... H03K 5/003; H03K 19/0175; H03K 19/017509; H03K 19/0185; H03K 19/018507; H03K 19/018521
See application file for complete search history.

(56) References Cited

U.S. PATENT DOCUMENTS

| 5,917,359 A | 6/1999 | Fukunaga et al. |
| 7,764,089 B2 * | 7/2010 | Iwabuchi ............... H02M 1/08 327/108 |

(Continued)

FOREIGN PATENT DOCUMENTS

| CN | 101917811 A | 12/2010 |
| CN | 103297030 A | 9/2013 |
| CN | 103325419 A | 9/2013 |

OTHER PUBLICATIONS

International Search Report for PCT/CN2016/106443, dated Jul. 27, 2017 (3 pages).

*Primary Examiner* — Patrick O Neill
(74) *Attorney, Agent, or Firm* — Tuenlap Chan; Charles A. Brill; Frank D. Cimino

(57) ABSTRACT

A lever shifter includes an output driver and a high-side gate driver. The high-side gate driver is configured to drive the high-side output transistor, and is coupled to an on pulse signal line that conducts an on pulse, and is coupled to an off pulse signal line that conducts an off pulse. The high-side gate driver includes a blocking circuit configured to enable generation of a drive signal to the high-side output transistor based on a voltage of a first of the on or off pulse signal line being greater than a first predetermined amount and a voltage of a second of the on or off signal line being less than a second predetermined amount.

10 Claims, 4 Drawing Sheets

Related U.S. Application Data continuation of application No. 15/480,510, filed on Apr. 6, 2017, now Pat. No. 9,979,397, which is a continuation of application No. PCT/CN2016/106443, filed on Nov. 18, 2016.

(51) Int. Cl.
*H03K 19/0175* (2006.01)
*H03K 17/0412* (2006.01)
*H03K 5/003* (2006.01)

(52) U.S. Cl.
CPC .............. *H03K 17/04123* (2013.01); *H03K 19/017509* (2013.01); *H03K 2217/0063* (2013.01); *H03K 2217/0072* (2013.01); *H03K 2217/0081* (2013.01)

(56) References Cited

U.S. PATENT DOCUMENTS

| | | |
|---|---|---|
| 7,782,115 B2 | 8/2010 | Ochi |
| 7,893,730 B2 | 2/2011 | Jung et al. |
| 8,013,655 B2 | 9/2011 | Herzer et al. |
| 8,253,472 B2 | 8/2012 | Nishijima et al. |
| 9,900,009 B2 | 2/2018 | Akahane |
| 9,979,397 B1 | 5/2018 | Zhu et al. |
| 10,230,372 B2 * | 3/2019 | Zhu ................ H03K 19/018507 |
| 2010/0301900 A1 | 12/2010 | Deng |
| 2013/0222072 A1 | 8/2013 | Van Den Boom |
| 2013/0249595 A1 | 9/2013 | Ogawa |
| 2018/0062653 A1 | 3/2018 | Lee |

* cited by examiner

HIGH VOLTAGE LEVEL SHIFTER WITH SHORT PROPAGATION DELAY

CROSS REFERENCE TO RELATED APPLICATIONS

Under 35 U.S.C. §§ 120, 121, this divisional application claims benefits of priority to U.S. patent application Ser. No. 15/959,176, which is a continuation application that claims benefits of and priority to U.S. patent application Ser. No. 15/480,510 (TI-76916), filed on Apr. 6, 2017 (now U.S. Pat. No. 9,979,397), which is a continuation of PCT/CN2016/106443, filed on Nov. 18, 2016, the entirety of which are hereby incorporated herein by reference.

BACKGROUND

Level shifters are utilized in electronic circuits for changing the voltage of a signal from one voltage level to another voltage level. For example, some electronic circuits employ different power domains, wherein different reference voltages are used to power the circuitry in each power domain. The reference voltage in a power domain defines the voltage levels that represent an asserted logic state (e.g. a logic value of "1") and a negated logic state (e.g. a logic value of "0") for signals in the power domain. In order to ensure proper communication of information between power domains, a level shifter can be employed to shift the voltage of a signal communicated across the power domains so that the logic state represented by the signal is consistent over the power domains.

Level shifters are sometimes used in applications where input logic voltage level signals are translated to output signals at higher voltage levels. For example, automotive, electronic data processing, and industrial control applications may require high voltage level shifters to drive various peripheral devices. Such circuits are often implemented in application specific integrated circuits (ASICs) or as independently packaged circuits. High voltage level shifters may translate a logic level (e.g., 0 to 5 volts) input signal to signals at higher voltage levels.

High voltage level shifters having short propagation delay are disclosed herein. In one embodiment, a high voltage lever shifter includes an output driver, a pulse generator, and a high-side gate driver. The output driver is configured to switch a voltage of at least 200 volts. The output driver includes a high-side output transistor. The pulse generator is configured to generate an on pulse at a first edge of an input signal received at an input terminal of the level shifter and to generate an off pulse at a second edge of the input signal. The high-side gate driver is configured to drive the high-side output transistor. The high-side gate driver is coupled to an on pulse signal line that conducts the on pulse and is coupled to an off pulse signal line that conducts the off pulse. The high-side gate driver includes a blocking circuit configured to detect a voltage of the on pulse signal line, to detect a voltage of the off pulse signal line, and to inhibit generation of a drive signal to the high-side output transistor based on a difference of the voltage of the on pulse signal line and the voltage of the off pulse signal line being less than a predetermined amount.

In another embodiment, a transistor driver includes a pulse generator, a blocking circuit coupled to the pulse generator, and a latch coupled to the blocking circuit. The pulse generator is configured to generate an on pulse at a leading edge of an input signal received at an input terminal of the high-side transistor driver and to generate an off pulse at a trailing edge of the input signal. The pulse signal generator is configured to drive an on pulse signal line that conducts the on pulse and to drive an off pulse signal line that conducts the off pulse. The blocking circuit is configured to enable state change of a drive signal to drive a high-side drive transistor based on voltage of the on pulse signal line exceeding a first threshold and voltage of the off pulse signal line not exceeding a second threshold, or voltage of the off pulse signal line exceeding the first threshold and voltage of the on pulse signal line not exceeding the second threshold.

In a further embodiment, a level shifter includes an output driver, a pulse generator, and a high-side gate driver. The output driver is configured to switch a voltage of at least 200 volts. The output driver includes a high-side output transistor. The pulse generator is configured to generate an on pulse at a leading edge of an input signal received at an input terminal of the level shifter and to generate an off pulse at a trailing edge of the input signal. The high-side gate driver is configured to drive the high-side output transistor. The high-side gate driver is coupled to an on pulse signal line that conducts the on pulse and coupled to an off pulse signal line that conducts the off pulse. The high-side gate driver includes a blocking circuit comprising a plurality of transistors configured to inhibit a change in state of the drive signal to the high-side output transistor based on simultaneous assertion of signals on both the on pulse signal line and the off pulse signal line, and based on simultaneous negation of signals on both the on pulse signal line and the off pulse signal line.

BRIEF DESCRIPTION OF THE DRAWINGS

For a detailed description of various examples, reference will now be made to the accompanying drawings in which.

DETAILED DESCRIPTION

Figure 1:
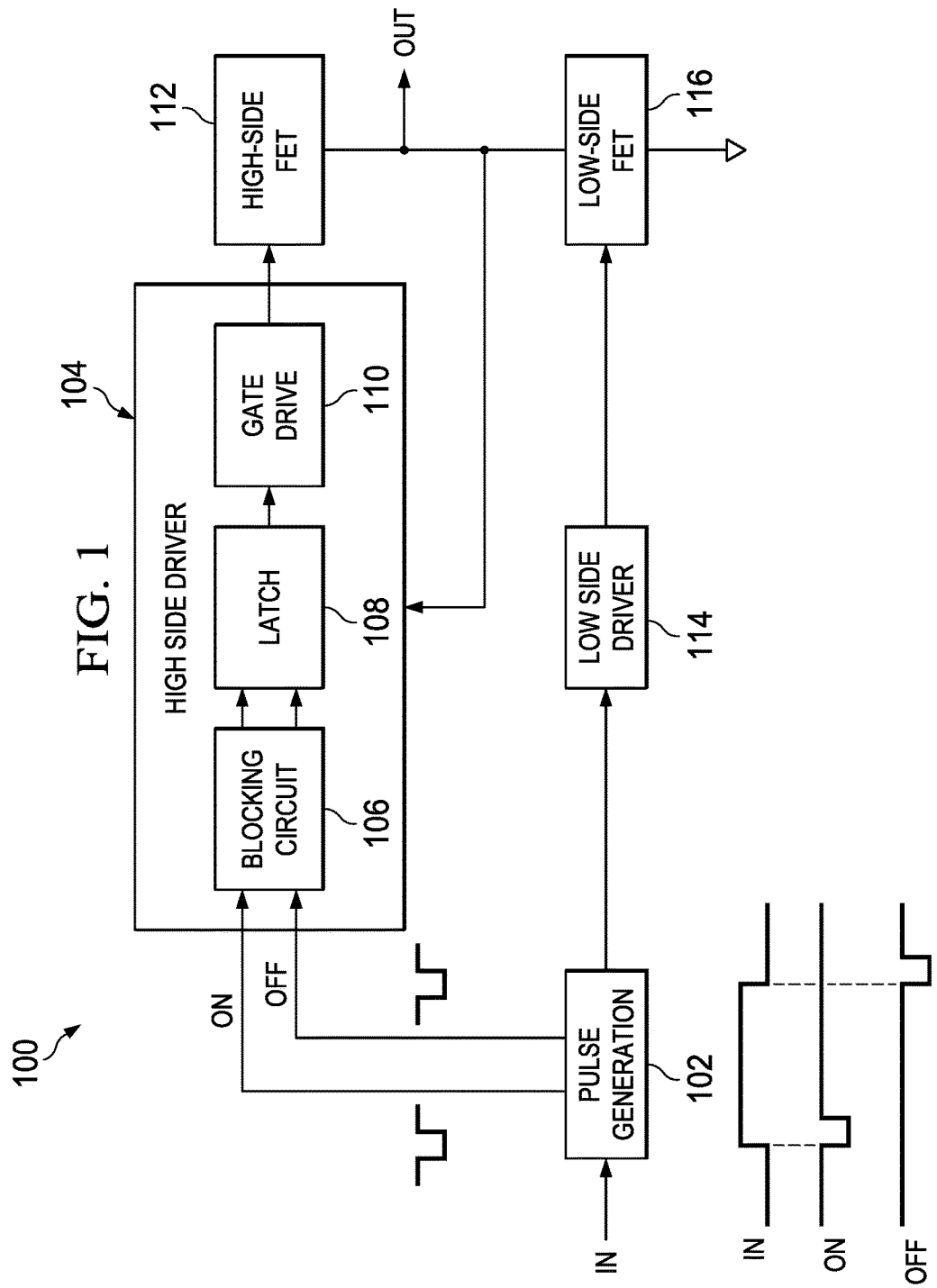
FIG. 1 shows a block diagram for a high-voltage level shifter that includes blocking circuitry to reduce the effects of transient disturbances in accordance with various embodiments.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to. . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be based on Y and any number of other factors.

In the drawings and description that follow, certain features of the invention may be shown exaggerated in scale or in somewhat schematic form, and some details of conventional elements may not be shown in the interest of clarity and conciseness. The present disclosure is susceptible to embodiments of different forms. Specific embodiments are described in detail and are shown in the drawings, with the understanding that the present disclosure is to be considered an exemplification of the principles of the disclosure, and is not intended to limit the disclosure to that illustrated and described herein. It is to be fully recognized that the different teachings and components of the embodiments discussed below may be employed separately or in any suitable combination to produce desired results.

To provide a high power density, power converters may implement a high switching frequency. Such power converters require transistor (e.g., field effect transistor) drivers with a low propagation delay. Conventional transistor drivers for switching less than 200 volts can provide propagation delay in a range of 15 nanoseconds (ns) to 30 ns. However, in the 600V range, conventional drivers may provide no less than 90 ns of propagation delay. Isolated gate driver technology can achieve 20 ns propagation delay, but is not cost competitive with other conventional driver technologies.

Conventional high voltage transistor drivers include a de-glitch filter to prevent disturbing signals (such as common mode signals) from affecting driver output. Unfortunately, the de-glitch filter increases driver propagation delay. Embodiments of the present disclosure provide immunity from erroneous driver transitions caused by common mode and other disturbing signals without implementation of a de-glitch filter. Instead of de-glitch filters that filter out a disturbing signal, the driver circuits disclosed herein include blocking circuitry that monitors the signals setting driver output state and blocks propagation of the signals if the signals are determined to be a result of a disturbing signal, such as a common mode transient. Because the drivers disclosed herein do not include a de-glitch filter, propagation delay may be substantially reduced relative to conventional drivers that employ a de-glitch filter. For example, embodiments of the high voltage driver and level shifter disclosed herein may provide a propagation delay of about 30 ns (e.g., 30 ns±5 ns) or less when switching 200 or more volts (e.g., 600 volts in some embodiments).

FIG. 1 shows a block diagram for a high-voltage level shifter 100 that includes blocking circuitry to reduce the effects of transient disturbances in accordance with various embodiments. The level shifter 100 includes pulse generation circuitry 102, a high side driver 104, a high side transistor 112, a low side driver 114, and a low side transistor 116. The pulse generation circuitry 102 receives an input signal (IN) and generates a pulse at each edge or transition of the IN signal from one logic level to another. For example, the pulse generation circuitry 102 may generate a pulse on the signal line labeled ON responsive to the IN signal transitioning from a "0" logic state to a "1" logic state, and generate a pulse on the signal line labeled OFF responsive to the IN signal transitioning from a "1" logic state to a "0" logic state.

The pulse generation circuitry 102 is coupled to the high side driver 104 via the ON signal line and the OFF signal line. The high side driver 104 includes a blocking circuit 106, a latch 108, and a gate driver 110. The blocking circuit 106 receives signals on the ON signal line and the OFF signal line. Outputs of the blocking circuit 108, which may correspond to the signals on the ON and OFF signal lines, set and reset the latch 108. An output of the latch 108 drives the high-side transistor 112 via the transistor gate driver 110. The high side driver 104 may be referenced to the output of the level shifter 100. That is, the output of the level shifter 100 may set a ground voltage for the high side driver 104. A power rail for the high side driver 104 may float, for example, from a supply voltage used to power the pulse generator 102, or other circuitry of the level shifter 100, to a voltage exceeding a high voltage connected to the high-side transistor 112 (e.g., >200 volts). Thus, the high side driver 104 reference voltage may be ground while the high-side transistor 112 is turned off and a much higher voltage (e.g., 600 volts) while the high-side transistor 112 is turned on in order to allow the high-side driver 104 to maintain control of the high-side transistor 112 while the high-side transistor 112 is on.

One or more outputs of the pulse generator 102 drive the low-side driver 114, which in turn drives the low-side transistor 116. Because the low-side transistor 116 is referenced to ground, control of the low-side transistor 116 is substantially less complex than control of the high-side transistor 112, and is not described herein.

The blocking circuit 106 monitors the voltage on the ON signal line and the voltage on the OFF signal line to determine whether signals present on the ON and OFF signal lines are pulses generated by the pulse generation circuitry 102. If the blocking circuit 106 determines that the signals on the ON and OFF signal lines are pulses generated by the pulse generation circuitry 102, then the blocking circuit 106 propagates the signals to the latch 108. If the blocking circuit 106 determines that the signals on the ON and OFF signal lines are not generated by the pulse generation circuitry 102, then blocking circuit 106 does not propagate the signals to the latch 108. The blocking circuit 106 may determine whether the signals present on the ON and OFF signal lines are to be propagated to the latch 108 based on the voltage levels present on the ON and OFF signal lines.

As shown in FIG. 1, at any time (e.g., at an edge of the signal IN), the pulse generation circuitry 102 drives a pulse onto only one of the ON or OFF signal lines. Accordingly, during normal pulse generation, the voltages on the ON and OFF signal lines will be substantially different. In contrast, noise (such as a common mode transient) may induce a simultaneous pulse on both the ON and OFF signal lines. Thus, voltages induced on the ON and OFF signal lines by a disturbance, such as a common mode transient, may produce a similar voltage level (e.g., a simultaneous pulse) on the ON and OFF signal lines. In embodiments of the driver 104, if the voltage on one of the ON or OFF signal lines is greater than a first predetermined voltage, and the voltage on the other of the ON or OFF signal lines is less than a second predetermined voltage, then the blocking circuitry 106 may propagate the signals to the latch 108, and the output of the latch 108 may change responsive to the signals. If the voltages on the ON and OFF signal lines are such that these conditions are not met (i.e., one is not higher than the first predetermined voltage or the other is not lower than the second predetermined voltage), then the blocking circuitry 106 may not pass the signals to the latch 108, and the output of the latch 108 will remain unchanged. Thus, the blocking circuit 106 prevents spurious transitions in the drive signal provided to the high-side transistor 112, while reducing propagation delay relative to conventional high-voltage drivers.

Figure 2:
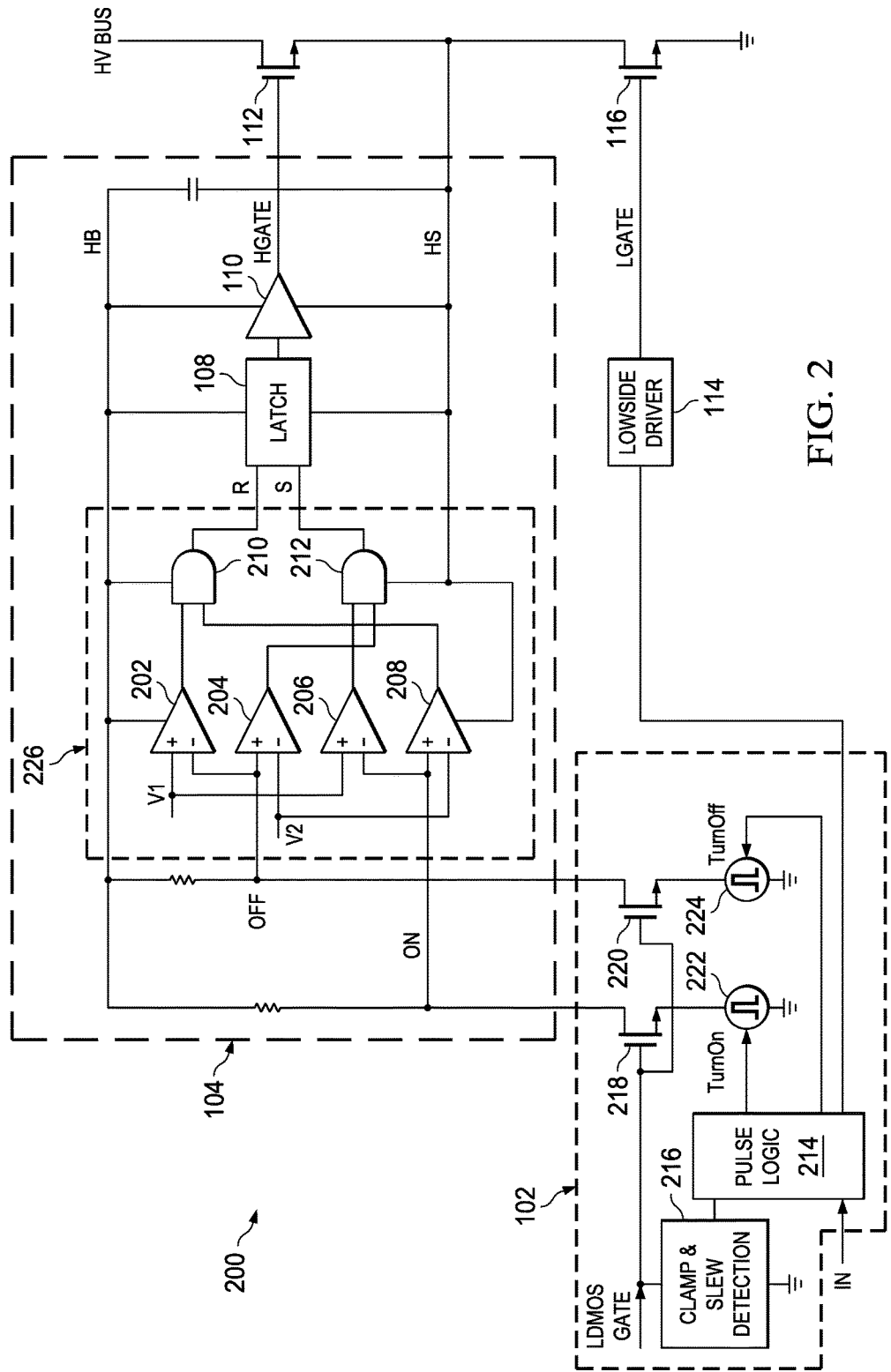
FIG. 2 shows a schematic diagram for a high-voltage level shifter that includes blocking circuitry to reduce the effects of transient disturbances in accordance with various embodiments.

FIG. 2 shows a schematic diagram for a high-voltage level shifter 200 that includes blocking circuitry 226 to reduce the effects of transient disturbances in accordance with various embodiments. The high-voltage level shifter 200 is an embodiment of the high-voltage level shifter 100. The high-voltage level shifter 200 includes pulse generation circuitry 102, high side driver 104, high side transistor 112, low side driver 114, and low side transistor 116. The pulse generation circuitry 102 includes pulse logic 214, clamp and slew detection circuitry 216, transistors 218 and 220, and current sources 222 and 224. Transistors 218 and 220 may be laterally diffused metal oxide semiconductor (LDMOS) transistors. The clamp and slew detection circuitry 216 generates a clamp voltage that drives the control terminal (e.g., gate) of the transistors 218 and 220 to ensure proper operation. The clamp and slew detection circuitry 216 may also detect slewing in the high side driver 104 via the parasitic capacitance of the transistor 218 and/or the transistor 220. The pulse logic 214 generates pulse TurnON or TurnOff at each transition of the IN signal. The pulses TurnON and TurnOff control the current sources 222 and 224 respectively, which in turn produce corresponding pulses on the ON and OFF signal lines. The signals on the ON and OFF signal lines may be active low signals.

The high side driver 104 includes a blocking circuit 226, a latch 108, and a gate driver 110. The blocking circuit 226 may be an embodiment of the blocking circuit 106. The blocking circuitry 226 includes comparators 202, 204, 206, and 208, and "AND" gates 210 and 212. The comparators 202, 204, 206, and 208 compare the voltages present on the ON and OFF signal lines to reference voltages to determine whether the signals present on the ON and OFF signal lines should be propagated to the latch 108. In FIG. 2, the reference voltages are designated V1 and V2. The voltages V1 and V2 may be set as needed to specify a desired differential between and level of the voltage of the ON and OFF signal lines required to propagate signals to the latch 108. For example, in the level shifter 200, V1 may be set to HB-2 volts, and V2 may be set to HB-1 volt. Other embodiments may apply different values of V1 and V2.

Comparators 202 and 208 are coupled to the "AND" gate 210 to control resetting of the latch 108, and the comparators 204 and 206 are coupled to the "AND" gate 212 to control setting of the latch 108. If the signal voltage on the OFF signal line exceeds reference voltage V2 and the signal voltage on the ON signal line is lower than the reference voltage V1, then the blocking circuitry 226 will drive a SET input of the latch 108. Similarly, if the signal voltage on the ON signal line exceeds reference voltage V2 and the signal voltage on the OFF signal line is lower than the reference voltage V1, then the blocking circuitry 226 will drive a RESET input of the latch 108. If the signals on the ON and OFF signal lines provide neither of these two specific conditions, then the state of the latch 108 is unchanged. As noted above, common mode transients and other disturbing signals tend to induce a similar voltage on both the ON and OFF signal lines. Accordingly, if the signal on the ON signal line exceeds the reference voltage V1, the blocking circuitry 226 prevents change in the driver output regardless of whether signal on the OFF signal line exceeds the reference voltage V2. Similarly, if the signal on the OFF signal line exceeds the reference voltage V1, the blocking circuitry 226 prevents change in the driver output regardless of whether signal on the ON signal line exceeds the reference voltage V2. Accordingly, the blocking circuitry 226 prevents common mode transients from causing unintended changes in the state of the output of the high side driver 104 with little or no increase in propagation delay through the high side driver 104.

Figure 3:
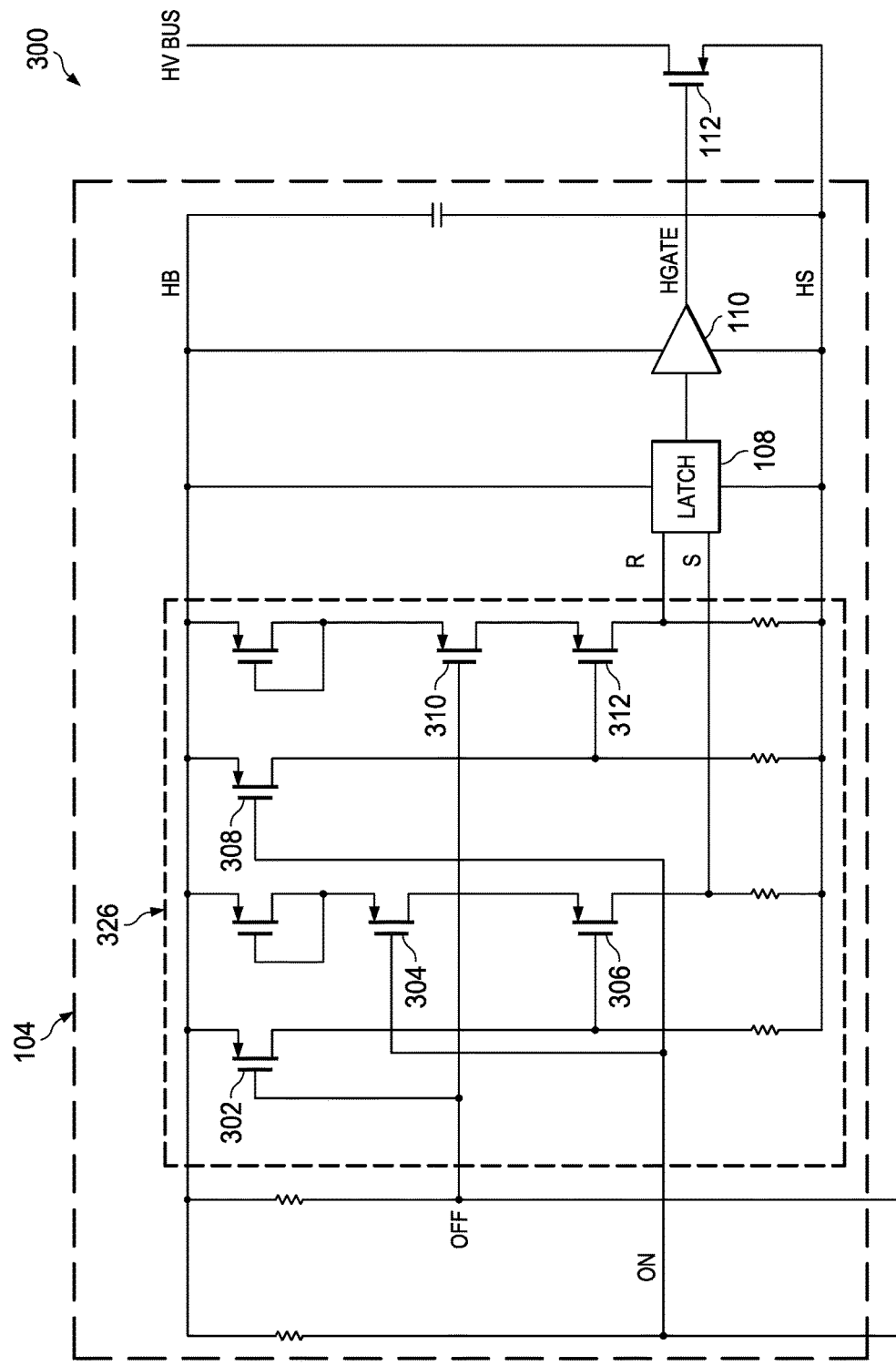
FIG. 3 shows a schematic diagram for a high-voltage level shifter that includes blocking circuitry to reduce the effects of transient disturbances in accordance with various embodiments.

FIG. 3 shows a schematic diagram for a high-voltage level shifter 300 that includes blocking circuitry 326 to reduce the effects of transient disturbances in accordance with various embodiments. The high-voltage level shifter 300 is an embodiment of the high-voltage level shifter 100, and the blocking circuitry 326 is an embodiment of the blocking circuitry 106. The high-voltage level shifter 300 includes the various components of the high-side level shifter 100, but the pulse generation circuitry 102, low side driver 114, and the low side transistor 116 are not shown in FIG. 3. In the level shifter 300, the blocking circuitry 326 includes a number of transistors 302-312 arranged to control propagation of signals on the ON and OFF signal lines to the latch 108. The signals on the ON and OFF signal lines may be active low signals. In the blocking circuitry 326, the difference in voltage of the ON signal line and the OFF signal line needed to trigger propagation of signal to the latch 108 may be defined by the voltage thresholds at which the transistors 302-312 turn on or off.

Transistors 302, 304, and 306 form a latch set circuit that controls propagation of signals to the set input of the latch 108. Generally, the set input of the latch 108 will be asserted when the voltage on the OFF signal line is "high" and the voltage on the ON signal line is "low." The high signal voltage on the OFF signal line turns off transistor 302, thereby pulling down the control terminal (e.g., the gate) of, and turning on, transistor 306. The low signal voltage on the ON signal line turns on transistor 304, thereby enabling current flow through transistors 304 and 306, and asserting the set input of the latch 108. The transistors 302, 304, and 306 hold the set input of the latch 108 negated under all conditions of the ON and OFF signal lines other than when high signal voltage is present on the OFF signal line and low signal voltage is present on the ON signal line.

Transistors 308, 310, and 312 form a latch reset circuit that controls routing of signals to the reset input of the latch 108. Generally, the reset input of the latch 108 will be asserted when the voltage on the ON signal line is "high" and the voltage on the OFF signal line is "low." The high signal voltage on the ON signal line turns off transistor 308, thereby pulling down the control terminal (e.g., the gate) of, and turning on, transistor 312. The low signal voltage on the OFF signal line turns on transistor 310, thereby enabling current flow through transistors 310 and 312, and asserting the reset input of the latch 108. The transistors 308, 310, and 312 hold the reset input of the latch 108 negated under all conditions of the ON and OFF signal lines other than when high signal voltage is present on the ON signal line and low signal voltage is present on the OFF signal line. Accordingly, the blocking circuitry 326 prevents common mode transients from causing unintended changes in the state of the output of the high side driver 104 with little or no increase in propagation delay through the high side driver 104.

Figure 4:
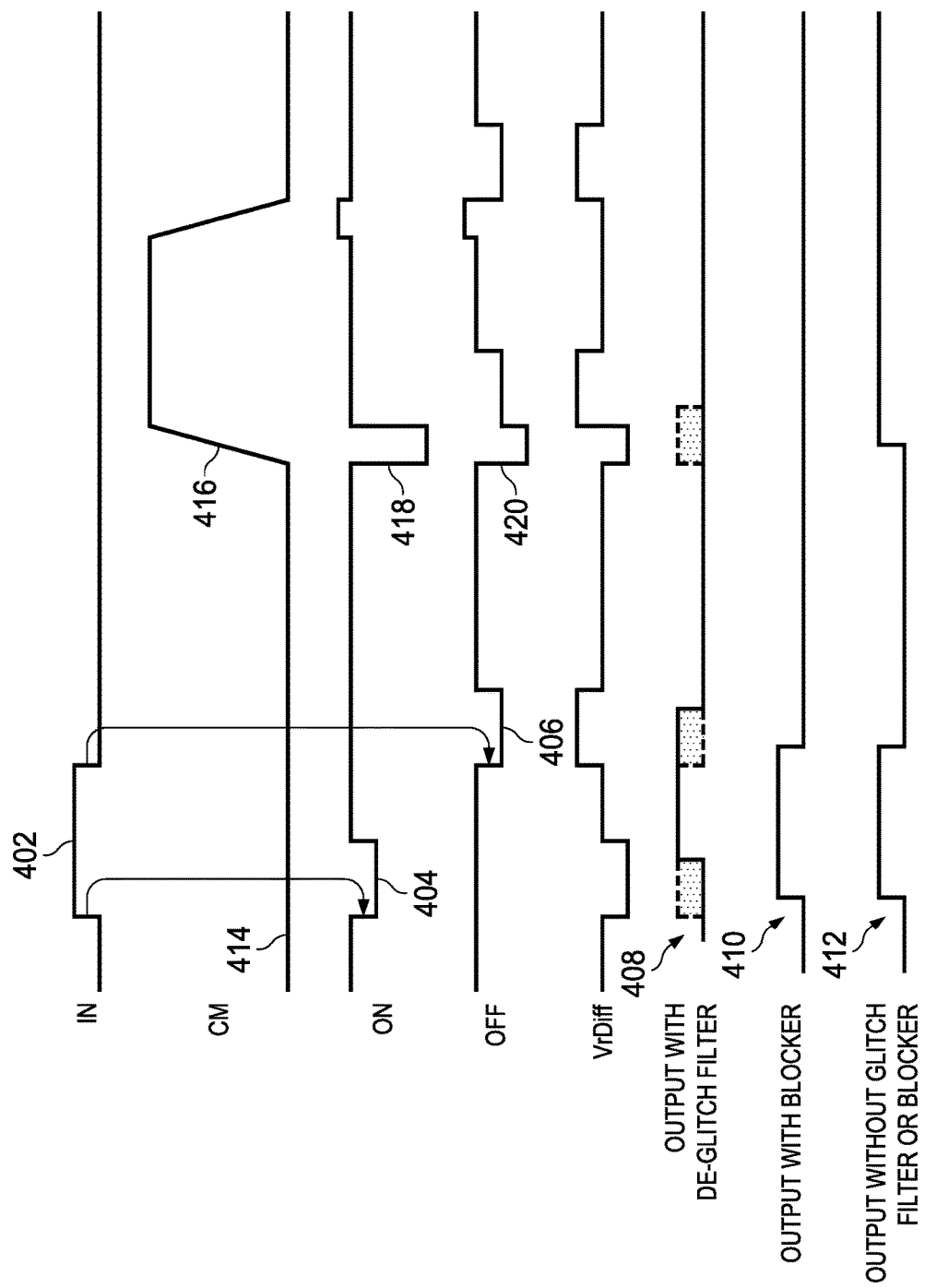
FIG. 4 shows examples of signals in high voltage level shifters with and without blocking circuitry as disclosed herein.

FIG. 4 shows examples of signals in high voltage level shifters with and without blocking circuitry as disclosed herein. In FIG. 4, a pulse 402 is received by the pulse generation circuitry 102, and in turn, the pulse generation circuitry 102 produces pulse 404 responsive to the leading edge of the pulse 402 and produces pulse 406 responsive to the trailing edge of the pulse 402. The signal DIFF reflects the difference between the voltages on the ON and OFF signal lines.

The signal 408 represents the output of a conventional level shifter that includes a de-glitch filter. As shown in FIG. 4, the output of the level shifter is substantially delayed from the leading edge of the pulse 404 by the de-glitch filter. Similarly, the output of the level shifter is substantially delayed from the leading edge of the pulse 406 by the de-glitch filter.

The signal 410 represents the output of the level shifter 100 that includes blocking circuitry 106 rather than a de-glitch filter. As shown in FIG. 4, the delay of the signal 410 is greatly reduced relative to the signal 408 produced using a de-glitch filter.

The signal 412 represents the output of level shifter that lacks both a de-glitch filter and the blocking circuitry 106. As shown in FIG. 4, the delay of the signal 412 is similar to that provided by the level shifter 100. However, the level shifter that generated output 412 is prone to erroneous output transitions caused by transient signals. Signal 414 represents a high voltage common mode signal in the level shifters. Mismatches between components (i.e., transistors, resistors, etc.) of the level shifter can result in signal voltage differentials that trigger a state change in the level shifter that lacks a de-glitch filter or the blocking circuitry 106. In FIG. 4, the common mode pulse 416 produces pulses 418 and 420 on the ON signal line and the OFF signal line with sufficient differential to erroneously set the output 412. The blocking circuitry 106 of the level shifter 100 prevents the state of the latch 108 from changing responsive to the pulses 418 and 420.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A device comprising:
   a blocking circuit having:
      a first comparator including a first non-inverting input coupled to a first reference voltage source, a first inverting input coupled to an first signal node, and a first comparator output;
      a second comparator including a second non-inverting input coupled to a second signal node, a second inverting input coupled to a second reference voltage source, and a second comparator output; and
      an AND gate having a first input coupled to the first comparator output, a second input coupled to the second comparator output, and a reset output; and
   a set-reset (SR) latch having a reset input coupled to the reset output of the AND gate, and a latch output associated with a high side output terminal.

2. The device of claim 1, wherein:
   the blocking circuit includes:
      a third comparator including a third non-inverting input coupled to the first signal node, a third inverting input coupled to the second reference voltage source, and a third comparator output;
      a fourth comparator including a fourth non-inverting input coupled to the first reference voltage source, a fourth inverting input coupled to the second signal node, and a fourth comparator output; and
      a second AND gate having a third input coupled to the third comparator output, a fourth input coupled to the fourth comparator output, and a set output; and
   the SR latch having a set input coupled to the set output of the second AND gate.

3. The device of claim 1, wherein the first signal node is configured to conduct an OFF signal for turning off a high side transistor, and the second signal node is configured to conduct an ON signal for turning on the high side transistor.

4. The device of claim 1, further comprising:
   a voltage supply rail coupled to the first comparator, the second comparator, the AND gate, and the SR latch;
   a first resistor coupled between the first signal node and the voltage supply rail; and
   a second resistor coupled between the second signal node and the voltage supply rail.

5. The device of claim 1, further comprising:
   a voltage supply rail configured to supply a high-side floating supply (HB) voltage to the first comparator, the second comparator, the AND gate, and the SR latch, wherein:
      the second reference voltage source is configured to generate a second reference voltage lower than the HB voltage; and
      the first reference voltage source is configured to generate a first reference voltage lower than the second reference voltage.

6. The device of claim 1, further comprising:
   a gate driver circuit having a gate driver input coupled to the latch output, and a gate driver output coupled to the high side output terminal.

7. A device comprising:
   a blocking circuit having:
      a first comparator configured to generate a first comparator output signal when a first reference voltage is less than an OFF signal; and
      a second comparator configured to generate a second comparator output signal when an ON signal is less than a second reference voltage; and
   a logic circuit configured to reset a gate driver signal upon detecting the first comparator output signal and the second comparator output signal.

8. The device of claim 7, wherein:
   the blocking circuit includes:
      a third comparator configured to generate a third comparator output signal when the OFF signal is less than the second reference voltage; and
      a fourth comparator configured to generate a fourth comparator output signal when the first reference voltage is less than the ON signal; and
   the logic circuit configured to set the gate driver signal upon detecting the third comparator output signal and the fourth comparator output signal.

9. The device of claim 8, wherein the logic circuit includes:
   a first AND gate having a first input coupled to receive the first comparator output signal, a second input coupled to receive the second comparator output signal, and a reset output;
   a second AND gate having a third input coupled to receive the third comparator output signal, a fourth input coupled to receive the fourth comparator output signal, and a set output; and
   a set-reset (SR) latch having a reset input coupled to the reset output of the first AND gate, a set input coupled to the set output of the second AND gate, and a latch output.

10. The device of claim 7, further comprising:
a voltage supply rail configured to supply a high-side floating supply (HB) voltage to the first comparator, the second comparator, the logic circuit,
wherein:
the second reference voltage is lower than the HB voltage; and
the first reference voltage is lower than the second reference voltage.

* * * * *